(12) United States Patent
Baldo et al.

(10) Patent No.: US 9,688,531 B2
(45) Date of Patent: Jun. 27, 2017

(54) MICRO-ELECTRO-MECHANICAL DEVICE HAVING TWO BURIED CAVITIES AND MANUFACTURING PROCESS THEREOF

(71) Applicant: STMICROELECTRONICS S.R.L., Agrate Brianza (IT)

(72) Inventors: Lorenzo Baldo, Bareggio (IT); Enri Duqi, Milan (IT); Flavio Francesco Villa, Milan (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 15/191,160

(22) Filed: Jun. 23, 2016

(65) Prior Publication Data

US 2017/0144881 A1    May 25, 2017

(30) Foreign Application Priority Data

Nov. 19, 2015 (IT) ........................ 102015000074520

(51) Int. Cl.
*B81B 3/00* (2006.01)
*B81B 7/00* (2006.01)
*B81C 1/00* (2006.01)

(52) U.S. Cl.
CPC ........ *B81B 7/0045* (2013.01); *B81C 1/00325* (2013.01); *B81B 2201/0228* (2013.01); *B81B 2203/0127* (2013.01); *B81B 2203/0315* (2013.01); *B81B 2207/012* (2013.01); *B81C 2201/0173* (2013.01); *B81C 2203/0785* (2013.01)

(58) Field of Classification Search
CPC .......... B81B 7/0045; B81B 2201/0228; B81B 2203/0127; B81C 1/00325; B81C 2203/0785; B81C 2201/0173
See application file for complete search history.

(56) References Cited

U.S. PATENT DOCUMENTS

| 7,767,484 | B2 | 8/2010 | Ayazi | |
| 7,928,960 | B2* | 4/2011 | Baldo | ...................... G01L 5/223 345/156 |
| 8,173,513 | B2 | 5/2012 | Villa et al. | |
| 9,233,834 | B2 | 1/2016 | Faralli et al. | |
| 2009/0115008 | A1* | 5/2009 | Ziglioli | ............... B81C 1/00309 257/415 |
| 2010/0164025 | A1* | 7/2010 | Yang | .................... H04R 19/005 257/416 |
| 2010/0284553 | A1* | 11/2010 | Conti | .................... B81B 7/0061 381/174 |
| 2015/0001651 | A1 | 1/2015 | Faralli et al. | |

FOREIGN PATENT DOCUMENTS

EP    2789578 A2    10/2014

* cited by examiner

*Primary Examiner* — Yosef Gebreyesus
(74) *Attorney, Agent, or Firm* — Seed IP Law Group LLP

(57) ABSTRACT

A micro-electro-mechanical device formed in a monolithic body of semiconductor material accommodating a first buried cavity; a sensitive region above the first buried cavity; and a second buried cavity extending in the sensitive region. A decoupling trench extends from a first face of the monolithic body as far as the first buried cavity and laterally surrounds the second buried cavity. The decoupling trench separates the sensitive region from a peripheral portion of the monolithic body.

23 Claims, 7 Drawing Sheets

MICRO-ELECTRO-MECHANICAL DEVICE HAVING TWO BURIED CAVITIES AND MANUFACTURING PROCESS THEREOF

BACKGROUND

Technical Field

The present disclosure relates to a process for manufacturing MEMS (Micro-Electro-Mechanical System) devices having two buried cavities and to the micro-electro-mechanical device.

Description of the Related Art

As is known, sensors including micromechanical structures made, at least in part, of semiconductor materials employing MEMS technology are increasingly widely used, due to their advantageous characteristics of small dimensions, low manufacturing costs, and flexibility.

A MEMS sensor generally comprises a micromechanical sensing structure, which transduces a physical or mechanical quantity to be detected into an electrical quantity (for example, correlated to a capacitive variation); and an electronic reading circuit, usually formed as an ASIC (Application-Specific Integrated Circuit), which carries out processing operations (i.e., amplification and filtering) of the electrical quantity and supplies an electrical output signal, either analog (for example, a voltage) or digital (for example a PDM—Pulse Density Modulation—signal). The electrical signal, possibly further processed by an electronic interface circuit, is then made available to an external electronic system, for example a microprocessor control circuit of an electronic apparatus incorporating the sensor.

MEMS sensors comprise, for example, sensors for detecting physical quantities, such as inertial sensors, which detect acceleration or angular velocity data; sensors of derived signals, such as quaternions (data representing rotations and directions in three-dimensional space), gravity signals, etc.; motion sensors, such as step counters, running sensors, uphill sensors, etc.; and environmental signals, which detect quantities such as pressure, temperature, and humidity.

To sense the physical/mechanical quantity, MEMS sensors of the considered type comprise a membrane or a mass formed in or on a semiconductor chip and suspended over a first cavity. The membrane may face the external environment or be in communication therewith via a fluidic path.

U.S. Pat. No. 9,233,834 describes, for example, a MEMS device wherein a sensitive part of the device that forms the membrane is separated from the rest of the chip and supported by springs. The springs decouple the sensitive part from the rest of the chip and absorb the package stress, without transferring it to the sensitive part. In this device, the sensitive part is housed within or faces a second cavity that enables a limited movement of the sensitive part with respect to the rest of the chip.

In practice, the device has two cavities, where a first cavity defines the membrane and a second cavity enables decoupling of the sensitive part of the device from the rest. In the known device, to obtain the two cavities, two semiconductor wafers are used, which are bonded together. If the device is provided with a cap, this is formed in a third wafer, which is also bonded, as discussed hereinafter with reference to FIGS. 1 and 2.

FIG. 1 shows in a simplified way a MEMS sensor 1 formed in a chip 10 of semiconductor material, such as silicon. A cap 11 is fixed to a first face 10A of the chip 10, and a closing region 12 is fixed to a second face 10B of the chip 10 via spacers 26.

The chip 10 comprises a suspended region 13 separated from a peripheral portion 18 of the chip 10 through a trench 14. Elastic elements (also referred to as springs 15) support the sensitive region 13 and connect it mechanically to the peripheral portion 18. The sensitive region 13 houses a buried cavity 16 delimiting a membrane 19. The term "buried cavity" herein refers to an empty area (or an area filled with gas) within a semiconductor material body or chip, which extends at a distance from the two main faces of the body, being separated from these faces by portions of semiconductor and/or dielectric material.

A second cavity 21 extends underneath the sensitive region 13. The sensitive region 13 is provided with a stem 20 (also referred to as Z stopper) extending in the second cavity 21 and limiting oscillation of the sensitive region 13 in the event of impact or stresses that might damage the springs 15.

The cap 11 covers here at the top the entire first face 10A of the chip 10 and protects the latter from the external environment. The cap 11 is fixed via bonding regions 22, for example of metal such as gold, tin, or copper, or polymeric material or a glass material (glass-frit), fixed to the peripheral portion 18 and is thus spaced apart by a gap 23 from the first face 10A due to the thickness of the bonding regions 22. Further, the cap 11 has a through hole 24, which fluidically connects the membrane 19 to the environment that surrounds the chip 10.

The closing region 12 has a protection function during handling of the MEMS sensor 1 (for example, during transport to an assembly system). In general, the closing region 12 is constituted by a second chip housing electronic components, such as an ASIC, but may be constituted by another support, such as a printed-circuit board, or the like. Generally, the closing region 12 has a containment trench 17, to prevent material of the bonding regions 26 from reaching the mobile parts, limiting movement thereof in an undesired way.

By virtue of the second cavity 21, the sensitive region 13 bearing the sensitive part of the MEMS sensor (membrane 19) is free to move within certain limits in a vertical direction (perpendicular to the main extension plane of the chip 10 and thus to the faces 10A, 10B thereof) and is not affected by stress during manufacturing, in particular during packaging, in so far as the sensitive region 13 is mechanically decoupled from the peripheral portion.

The device of FIGS. 1 and 2 is formed by bonding three wafers together. In particular, initially (FIG. 3A) a first wafer 350 of monocrystalline silicon is processed for forming the buried cavities 16 delimiting the membranes 19 at the bottom. Formation of the buried cavities 16 may take place in various ways, for example as described in U.S. Pat. No. 8,173,513. Further, on a first face 350A of the first wafer 350 a gold layer is deposited so as to form first bonding and electrical-connection structures 351. In addition, the first wafer 350 is etched from the front using a silicon etching for laterally defining the trenches 14 and the springs 15.

In parallel, before or after (FIG. 3B), a second wafer 400 of monocrystalline silicon is provided with second bonding and electrical-connection structures 401 having a shape and dimensions that are congruent with those of the first bonding and electrical-connection structures 351. Next, using a resist mask, a deep silicon etch is carried out to form holes 403 and trenches 404. Etching is prolonged so that both the holes 403 and the trenches 404 have a greater depth than the thickness intended for the cap 11 (FIG. 1).

Then (FIG. 3C), the second wafer 400 is flipped over and fixed to the first wafer 350 via a wafer-to-wafer bonding process of a known type, to obtain a composite wafer 500.

Next (FIG. 3D), the first wafer 350 is thinned out from the back, to form the second cavities 21 and the stems 20, and is etched once again from the back, to release the suspended regions 13 and the springs 15. In addition, the second wafer 400 is thinned out until the bottom of the holes 403 and of the trenches 404 is reached.

After bonding a third wafer 410 and dicing the composite wafer 500 of FIG. 3D, the MEMS sensor 1 of FIG. 1 is thus obtained.

Consequently, in the process described, the MEMS device 1 is obtained by bonding three different wafers.

Thus, its thickness is considerable. Further, the process is rather complex in so far as it specifies bonding of three wafers.

BRIEF SUMMARY

One or more embodiments are directed to a MEMS device having two cavities and the manufacturing process thereof.

According to one embodiment a micro-electro-mechanical device is provided. The micro-electro-mechanical device comprises a monolithic body of semiconductor material having a first face and a second face. A first buried cavity is in the monolithic body and a sensitive region is in the monolithic body facing the first buried cavity. The device comprises a movable element over a second cavity that faces the first buried cavity. The device comprises a decoupling trench extending from the first face of the monolithic body as far as the first buried cavity. The decoupling trench separates the sensitive region from a peripheral portion of the monolithic body.

In at least one embodiment, the second cavity is buried in the sensitive region and the movable element is a membrane in the sensitive region and arranged between the second cavity and the first face. In another embodiment, the movable element and second cavity are spaced apart from the first face of the monolithic body and the movable element is supported by a structural element that is coupled to the first face of the monolithic body.

BRIEF DESCRIPTION OF THE SEVERAL VIEWS OF THE DRAWINGS

For a better understanding of the present disclosure, preferred embodiments thereof are now described, purely by way of non-limiting example, with reference to the attached drawings, wherein.

DETAILED DESCRIPTION

The present manufacturing process will be described hereinafter with reference to manufacturing a single sensitive structure, it being understood that it is replicated a number of times in a wafer, prior to dicing the wafer, in a per se known manner to the person skilled of the art.

Figure 1:
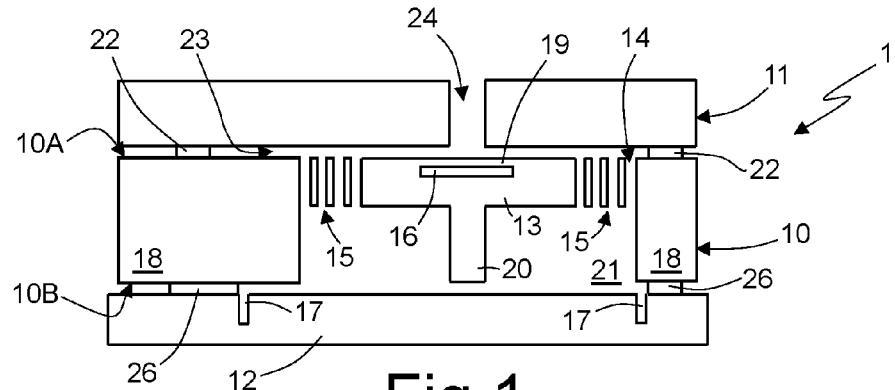
FIGS. 1 and 2 are, respectively, a cross-section and a top view of a known MEMS sensor.
Figure 2:
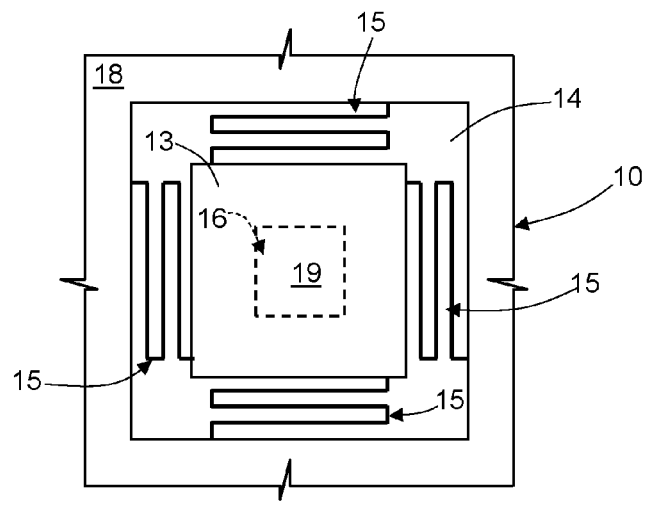
Figure 3A:
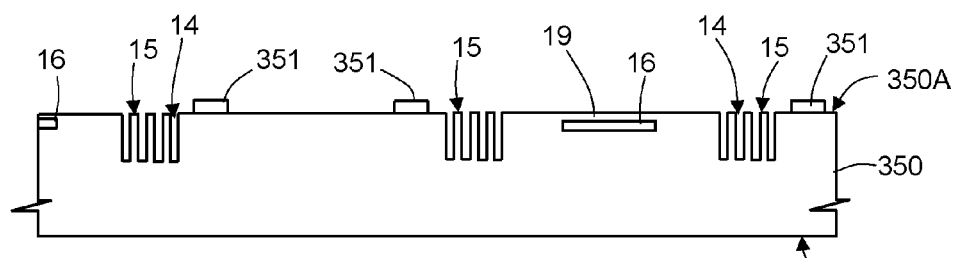
FIGS. 3A-3D are cross-sections of successive manufacturing steps of the MEMS sensor of FIG. 1.
Figure 3B:
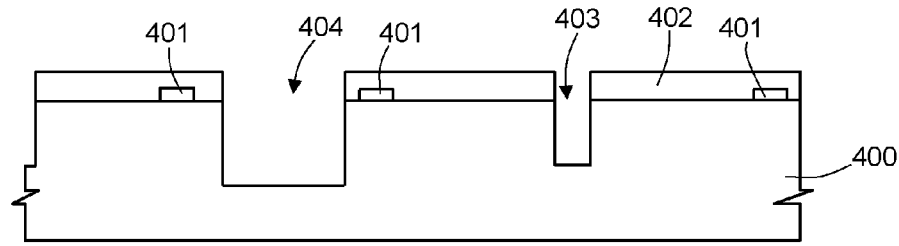
Figure 3C:
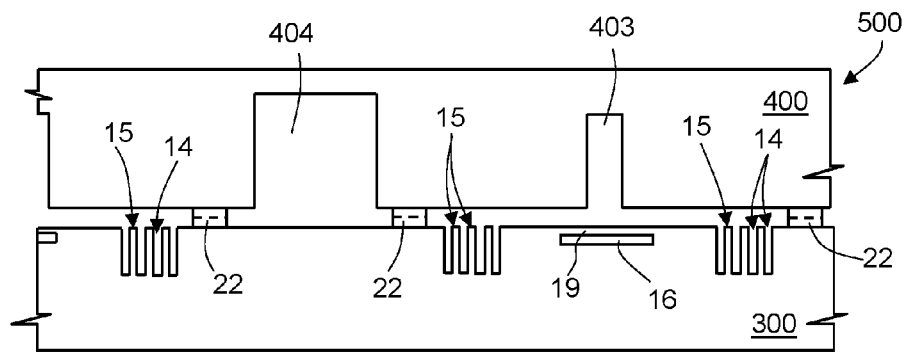
Figure 3D:
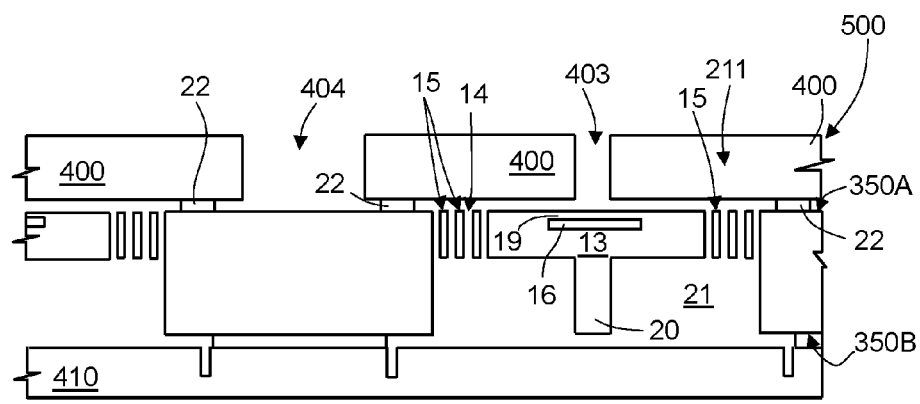
Figure 4A:
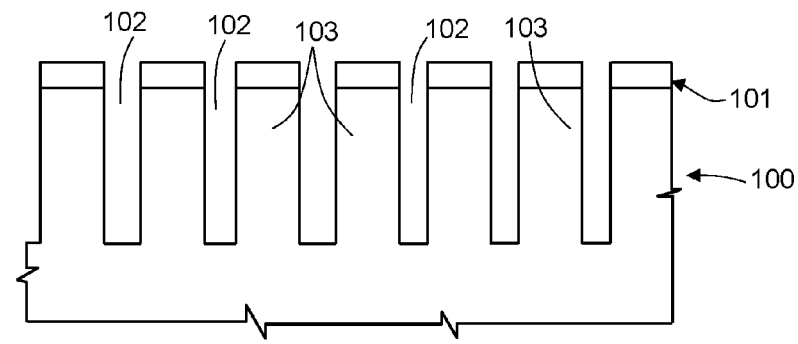
FIGS. 4A-4F show cross-sections of successive steps of an embodiment of the present manufacturing process.

Initially (FIG. 4A), a buried cavity is formed in an initial wafer 100 of semiconductor material. For example, to this end, the manufacturing process described in U.S. Pat. No. 8,173,513 and summarized briefly hereinafter may be used.

In detail, on the initial wafer 100, a resist mask 101 is formed having openings arranged according to a honeycomb configuration. Using the mask 101, the initial wafer 100 is anisotropically etched for forming a plurality of trenches 102, communicating with each other and delimiting a plurality of silicon columns 103.

Figure 4B:

With reference to FIG. 4B, the mask 101 is removed and an epitaxial growth is carried out in reducing environment. Consequently, an epitaxial layer, for example of an N type with a thickness of 30 µm, grows above the columns 103, closing the trenches 102 at the top and forming a first intermediate wafer 200.

A thermal annealing is carried out, for example for 30 minutes at 1190° C., preferably in hydrogen atmosphere, or, alternatively, in nitrogen atmosphere.

As discussed in the patents referenced above, annealing causes migration of the silicon atoms, which tend to move into a lower-energy position. Consequently, and also by virtue of the short distance between the columns 103, the silicon atoms of the latter migrate completely, and a first buried cavity 106 is formed. A thin silicon layer remains above the first buried cavity 106 and is formed in part by epitaxially grown silicon atoms and in part by migrated silicon atoms and forms a monosilicon closing layer 105.

In the embodiment shown (FIG. 4C), another epitaxial growth is carried out, of an N type or else a P type and of thickness of a few tens of micrometers, for example 50 µm, starting from the closing layer 105. A second intermediate wafer 201 is thus formed, which includes a first thick monosilicon region 108 that overlies the first buried cavity 106.

Figure 4C:
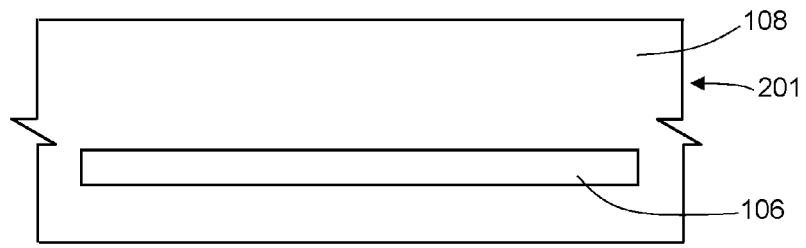
Figure 4D:
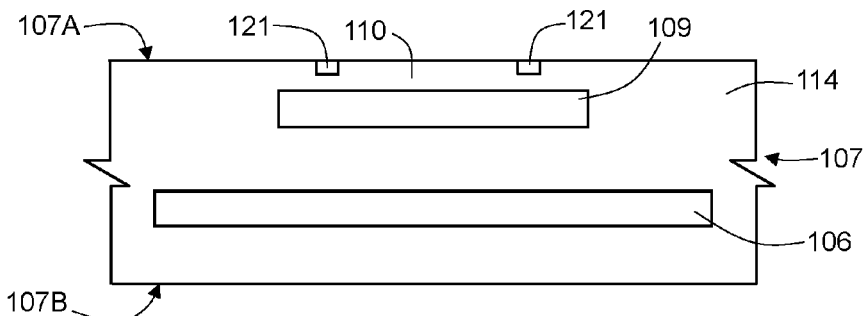

With reference to FIG. 4D, a second cavity 109 is formed in the first thick region 108, for example repeating the manufacturing process described in U.S. Pat. No. 8,173,513 (see also FIGS. 4A and 4B). In this way, a sensor wafer 107 is formed having a first and a second face 107A, 107B and, above the first cavity 106, a second thick region 114. The second thick region 114 accommodates a second cavity 109 and a membrane 110, which is delimited at the bottom of the second cavity 109 and faces the first face 107A. The second thick region 114 has, for example, a thickness of approximately 50 µm, and the membrane 110 has, for example, a thickness of approximately 10 µm.

If the application so specifies, electronic components 121 may be provided in the membrane 110, for example piezoresistors, via diffusion or implantation of dopant ion species, here of a P type, in a known manner and not shown. Further, in a per se known manner, electrical interconnections (not shown) may be provided on the first face 107A of the sensor wafer 107.

Figure 4E:
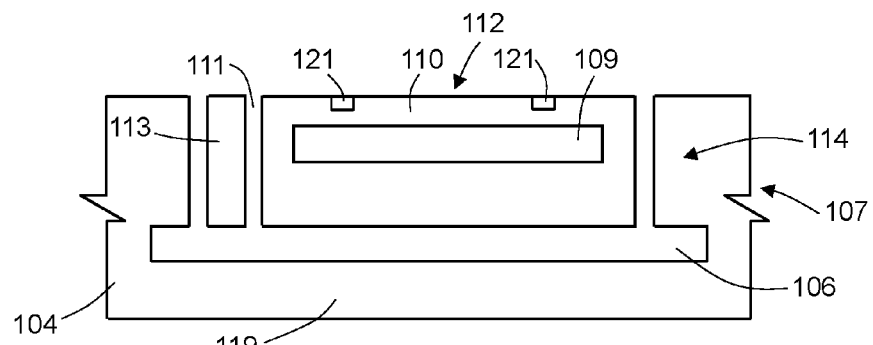
Figure 5:
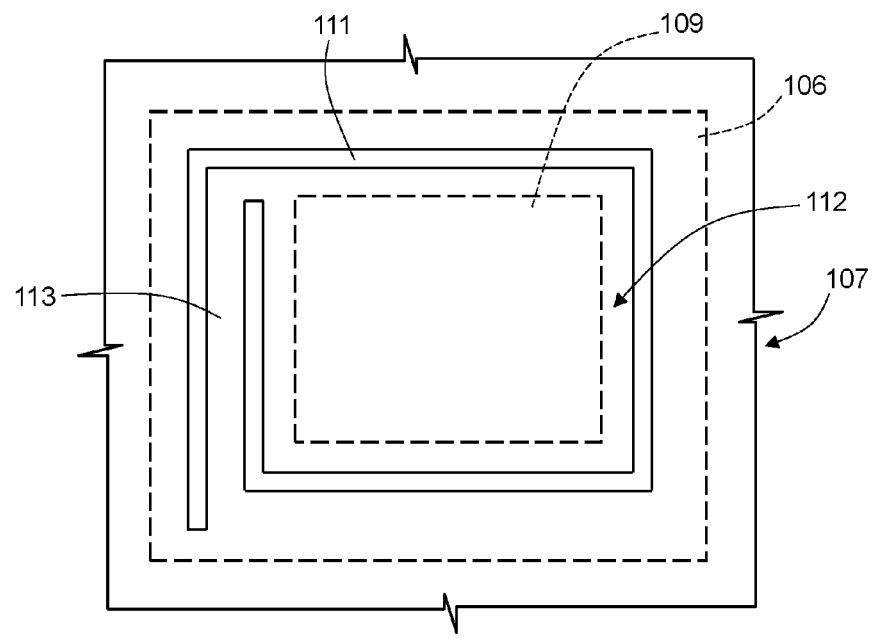
FIG. 5 is a top view of a detail of the wafer formed in step 4E of the present process.

With reference to FIG. 4E, using a masking layer (not shown), a deep silicon etch is carried out through the second thick region 114 until the first cavity 106 is reached. A trench 111 is thus formed, external to and surrounding the second cavity 109. In particular, in the embodiment shown, the trench 111 has the shape of a square spiral. In this way, as may be seen in the top view of FIG. 5, the trench 111 is formed by five sides delimiting a sensitive portion 112, and an arm or spring 113 connecting the sensitive portion 112 to the rest of the sensor wafer 107 (peripheral portion 104 and base 119).

A cap wafer 115 is fixed to the first face 107A of the sensor wafer 107. To this end, for example, bonding regions 116, for instance, of metal such as gold, tin, or copper, or of polymeric material or a glass based material (glass-frit) may be applied previously to the cap wafer 115 and/or to the sensor wafer 107. In this way, it is possible to electrically connect the electronic components 121, integrated in the second wafer 107, with conductive structures (not illustrated) in or on the cap wafer 115. The bonding regions 116 further form spacers between the first face 107A of the sensor wafer 107 and the cap wafer 115, thus delimiting a gap 117.

In the embodiment shown, the cap wafer 115 has a through hole 118 that enables fluidic connection between the gap 117 and the external environment and detection, by the membrane 110, of the external pressure.

The cap wafer 115 may further be provided with holes (not shown) for bonding wires (not shown). Alternatively, in a way not shown either, through-silicon vias (not shown) may be provided in the peripheral portion 104 of the sensor wafer 107 for electrical connection of the electrical components 121 with the second face 107B of the sensor wafer 107.

After dicing the sensor wafer 107 into a plurality of MEMS devices 120, each of them may be fixed to a support (not shown), for example an ASIC. Alternatively, the sensor wafer 107 may be fixed to a further wafer, prior to dicing, or to a printed-circuit board, in a way not shown.

According to a different embodiment, the second cavity may be formed via removal of a sacrificial layer.

In this case, the manufacturing process may comprise the same initial steps as those described above with reference to FIGS. 4A-4C.

Figure 6A:
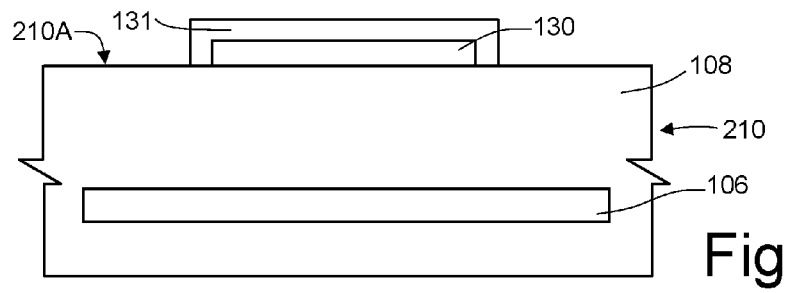
FIGS. 6A-6D are cross-sections of successive steps of another embodiment of the present manufacturing process.

Thus, starting from the structure of FIG. 4C, where the first cavity 106 has already been formed in the second intermediate wafer 201, a sacrificial region 130 is formed on the first thick region 108. The sacrificial region 130 is formed, for example, by depositing a sacrificial layer (for instance, of silicon oxide) and its definition via known photolithographic techniques (FIG. 6A). A structural layer 131 is deposited over the sacrificial region 130, for example a polycrystalline silicon layer grown by CVD, to form a sensor wafer 210 having a first, non-planar, face 210A, comprising a projecting area, corresponding to the structural layer 131, and a lowered area, corresponding to the exposed portion of the first thick region 108.

Figure 6B:
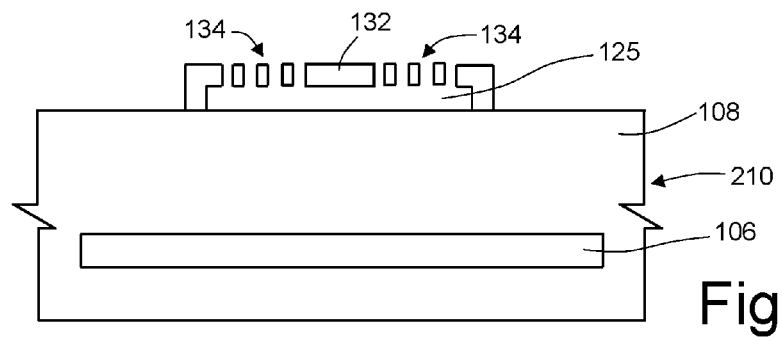
Figure 7:
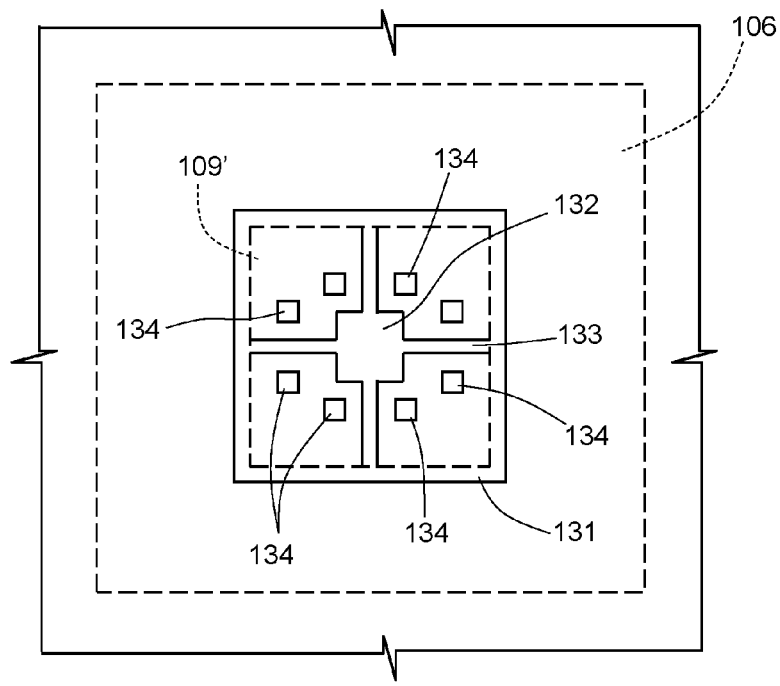
FIG. 7 is a top view of a detail of the wafer formed in step 6B of the present process.

With reference to FIG. 6B, the structural layer 131 is etched to define a micro-electro-mechanical structure of an inertial type, for example an accelerometer. In this case, as may be seen in the top view of FIG. 7, a suspended mass or platform 132, springs 133, connecting the platform 132 to the rest of the structural layer 131, and mobile and fixed electrodes 134, represented only schematically in FIG. 7, are defined.

The sacrificial region 130 is removed by etching the sacrificial material, for example in hydrofluoric acid for releasing the platform 132 and the mobile electrodes, thereby obtaining the structure of FIG. 6B, where a second cavity 125 extends underneath the platform 132.

Figure 6C:
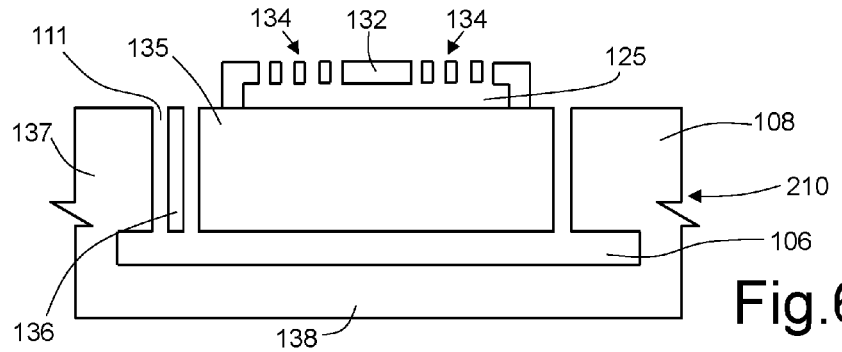
Figure 6D:
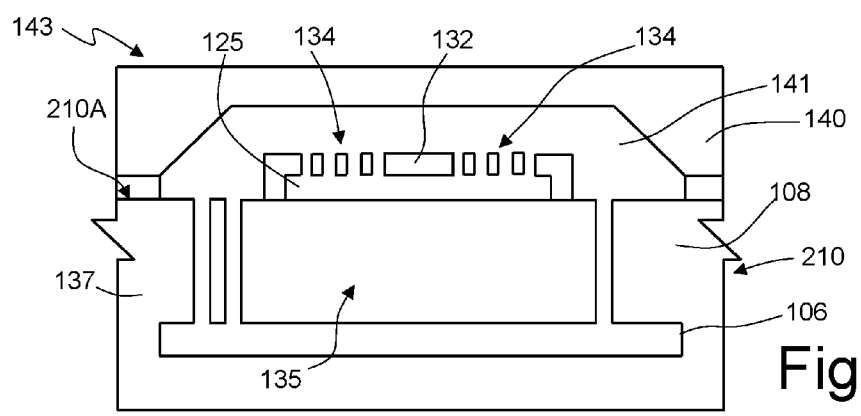
Figure 8:
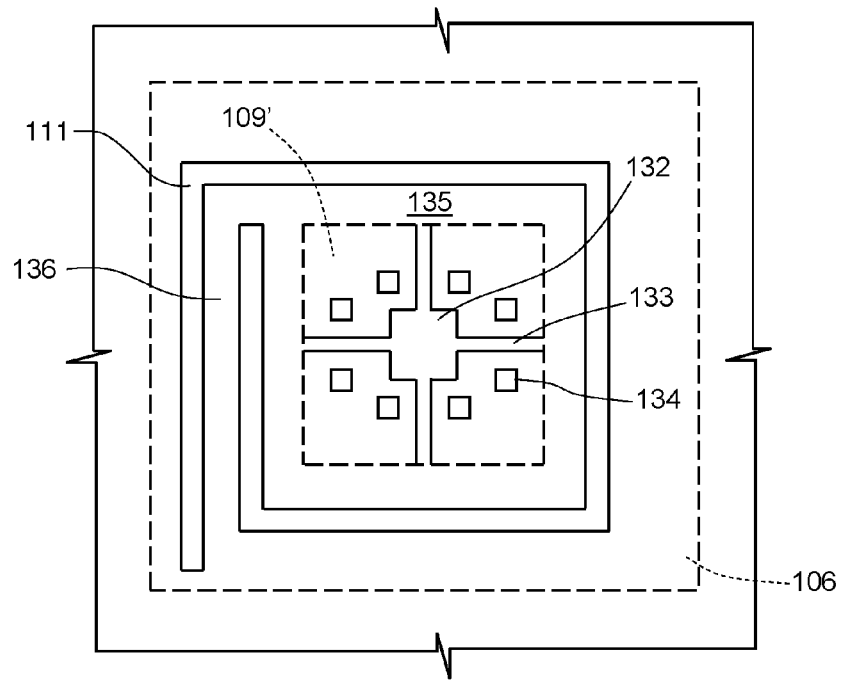
FIG. 8 is a top view of a detail of the wafer formed in step 6C of the present process.

Subsequently or previously, for example using a dry film (FIG. 6C) and analogously to what described with reference to FIG. 4E, using a masking layer (not shown) a deep silicon etch is made through the first thick region 108, outside the area of the structural layer 131, and thus outside the platform 132, until the first cavity 106 is reached. The trench 111 is thus formed, which, in top view (see FIG. 8) surrounds the second cavity 125 and the platform 132. Also here, the trench 111 has the shape of a square spiral and comprises five sides delimiting a sensitive portion 135, and an arm or spring 136 connecting the sensitive portion 135 to the rest of the sensor wafer 210, hereinafter also indicated as peripheral portion 137.

Figure 4F:
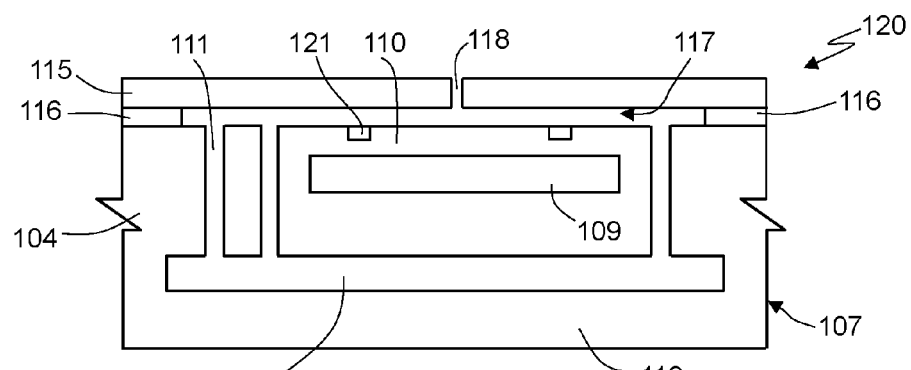

A cap wafer 140 is fixed to the first face 210A of the sensor wafer 210 analogously to what described with reference to FIG. 4F. In this case, since the surface 210A of the sensor wafer 210 is not planar and the platform 132 projects above the thick region 108, the cap wafer 140 has a recess 141 facing the sensitive region 135.

Also in this case, the cap wafer 140 may have holes (not shown) for passage of bonding wires, or, in a way not shown, through-silicon vias may be provided in the peripheral portion 137.

The sensor wafer 210 is diced into a plurality of MEMS devices 143, and, analogously to what already described, each of them may be bonded to a support or the sensor wafer 210 may be fixed to a further wafer, prior to dicing.

Figure 9:
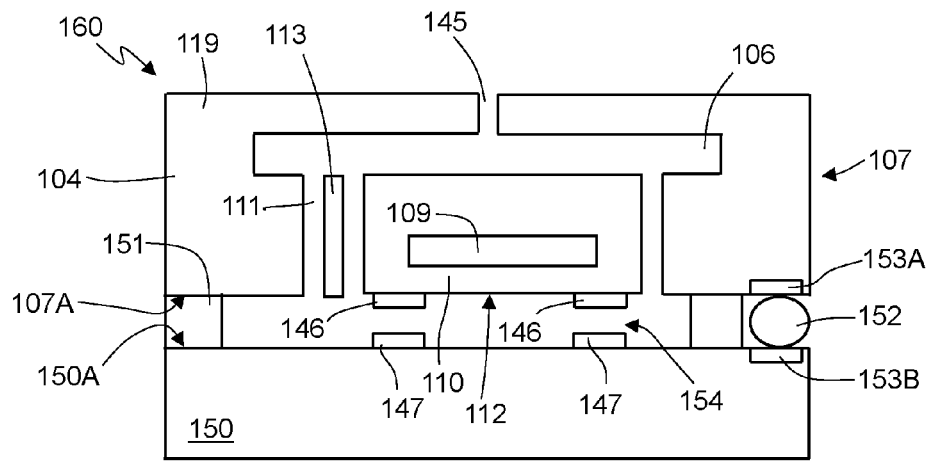
FIG. 9 is a cross-section of a different embodiment of the present MEMS device.

In a different embodiment (FIG. 9), the cap is formed directly by an ASIC, and the hole for connection to the external environment is formed directly in the sensor wafer, instead of in the cap.

In the embodiment shown, the sensor wafer 107 of FIG. 4E is used. The base portion 119 of the sensor wafer 107, underneath the first cavity 106 in the view of FIG. 4E, is here perforated by a deep silicon etch, analogous to the trench 111 etching. A connection hole 145 is thus obtained and connects the first cavity 106 to the external environment.

First stoppers 146, for example of dielectric material, such as silicon oxide, or metal material or polysilicon or a stack of different material layers, deposited and defined on the first face 107A, in a per se known manner, are further formed on the first face 107A of the sensor wafer 107.

Second stoppers 147 are formed on a face 150A of an ASIC wafer 150, in a position so as to face, at a distance, the first stoppers 146.

Spacer elements 151 as well as mechanical and electronic connection elements 152 are formed on the ASIC wafer 150 or on the sensor wafer 107.

The spacers 151 may be of materials including gold, copper, tin, glass-frit or polymers and may have a thickness of 5 µm.

The mechanical and electronic connection elements 152 may, for example, be formed by so-called "solder balls", arranged at contact pads 153A, 153B formed on the first face 107A of the sensor wafer 107 and a face 150A of the ASIC wafer 150.

The sensor wafer 107 and the ASIC wafer 150 are bonded together, with the first face 107A of the sensor wafer and the face 150A of the ASIC wafer 150 facing each other, thereby forming a composite wafer. Finally, the composite wafer is diced into a plurality of finished devices 160.

As an alternative to the above, the connection hole 145 may be formed at the end of the process, prior to dicing the composite wafer.

In this way, between the two faces 107A and 150A a gap 154 is formed, the thickness thereof is defined by the spacer elements 151, and the sensitive portion 112 may move in a limited way within the gap 154 or the first cavity 106, and is thus decoupled from the peripheral portion 104.

In addition, the membrane 110 is connected to the external environment through the trench 111, the first cavity 106, and the hole 145, thus forming a fluidic path.

The mechanical and electronic connection elements 152 enable, in addition to bonding the sensor wafer 107 and the ASIC wafer 150, their electrical connection.

As an alternative to the above, the sensor wafer 107 and/or the ASIC wafer 150 may be diced prior to bonding, in a per se known manner. Further, it is possible to form the cap and ASIC also starting from the structure of FIG. 6A, and thus with the second cavity 125 formed by removal of a sacrificial region.

Figure 10:
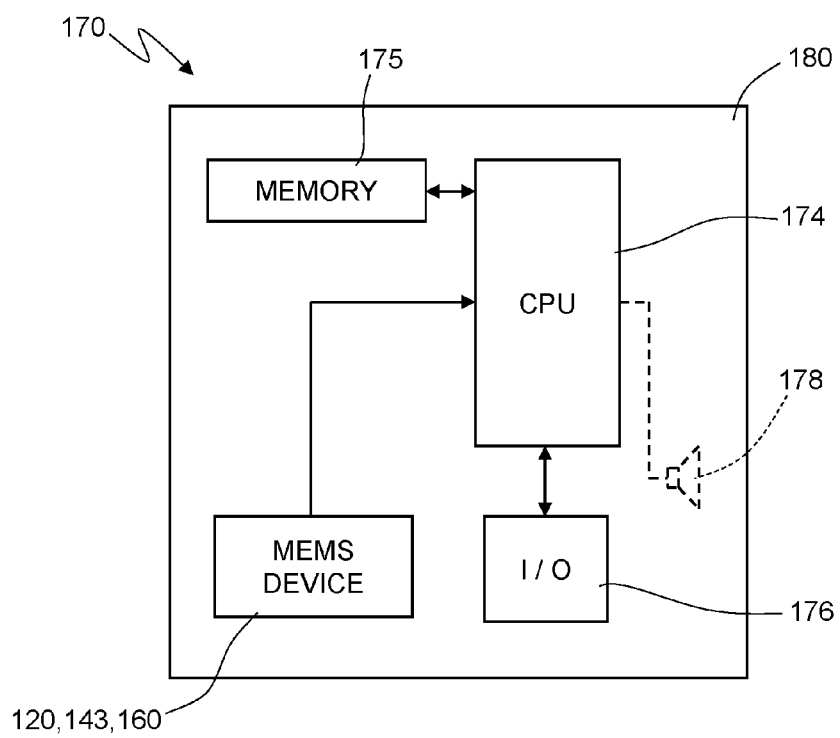
FIG. 10 shows an apparatus using the present MEMS device.

FIG. 10 is a schematic representation of an electronic apparatus 170 using the MEMS device 120, 143, 160.

The electronic apparatus 170 comprises, in addition to the MEMS device 120, 143, 160, a microprocessor 174, a memory block 175, connected to the microprocessor 174 and an input/output interface 176, also connected to the microprocessor 174. Further, a speaker 178 may be present for generating a sound on an audio output (not shown) of the electronic apparatus 170.

In particular, the electronic apparatus 170 is fixed to a supporting body 180, for example formed by a printed circuit.

The electronic apparatus 170 is, for example, an apparatus for measuring blood pressure (sphygmomanometer), a household apparatus, a mobile communication device (a cellphone, a PDA—Personal Digital Assistant—, or a notebook) or an pressure measuring apparatus that may be used in the automotive sector or in the industrial field in general.

In this way, the devices 120, 143, 160 may be formed with a lower number of wafers as compared to the devices currently produced, since both the cavities (i.e., the first cavity 106 and the second cavity 109 or 125) are formed in a same monolithic substrate, without bonding two wafers together.

In this way, the manufacturing costs are considerably reduced. Further, it is possible to reduce the thickness of the finished device, for a same robustness. Finally, it is possible to reduce problems of contamination and/or delimitation of the gluing materials, without forming specific containment trenches.

Finally, it is clear that modifications and variations may be made to the device and the manufacturing process described and illustrated herein, without thereby departing from the scope of the present disclosure. For example, the described embodiments may be combined for providing further solutions. In particular, the MEMS device 120 may be a sensor or an actuator of a different type, which may be obtained using MEMS technology and specify a mechanical decoupling from the rest of the chip.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A micro-electro-mechanical device, comprising:
   a monolithic body of semiconductor material having a first face and a second face;
   a first buried cavity in the monolithic body of semiconductor material;
   a sensitive region in the monolithic body facing the first buried cavity;
   a movable element over a second cavity that faces the first buried cavity; and
   a decoupling trench extending from the first face of the monolithic body as far as the first buried cavity, the decoupling trench separating the sensitive region from a peripheral portion of the monolithic body.

2. The device according to claim 1, wherein the second cavity is buried in the sensitive region, wherein the movable element is a membrane in the sensitive region and arranged between the second cavity and the first face.

3. The device according to claim 2, wherein the membrane accommodates electronic components.

4. The device according to claim 1, wherein the movable element and the second cavity are spaced apart from the first face of the monolithic body, the movable element supported by a structural element that is coupled to the first face of the monolithic body.

5. The device according to claim 4, wherein the movable element is part of a MEMS inertial sensor.

6. The device according to claim 1, wherein the decoupling trench has a spiral shape delimiting the sensitive region and an arm, the sensitive region and the arm being suspended over the first buried cavity, the arm supporting the sensitive region and coupling the sensitive region to the peripheral region of the monolithic body.

7. The device according to claim 1, further comprising a cap element bonded to the monolithic body and facing the first face of the monolithic body.

8. The device according to claim 7, wherein the cap element is an ASIC.

9. The device according to claim 1, wherein the device forms a pressure sensor, wherein the monolithic body includes a base region extending between the first buried cavity and the second face of the monolithic body and a through hole traversing the base region.

10. A process for manufacturing a micro-electro-mechanical device, the process comprising:
    forming a first buried cavity in a monolithic body of semiconductor material, wherein forming the first buried cavity forms a sensitive region facing the first buried cavity;
    forming a second buried cavity in the sensitive region of the monolithic body; and
    forming a decoupling trench extending from a first face of the monolithic body, the decoupling trench and the first buried cavity being in fluid communication with each other, the decoupling trench laterally surrounding the second buried cavity, the decoupling trench separating the sensitive region from a peripheral portion of the monolithic body.

11. The process according to claim 10, wherein after forming the first buried cavity, the process comprises increasing a thickness of the sensitive region over the first buried cavity.

12. The process according to claim 11, wherein increasing the thickness of the sensitive region comprises epitaxially growing an epitaxial layer, the epitaxial layer forming a part of the sensitive region.

13. The process according to claim 10, wherein forming the first buried cavity comprises:
    forming a plurality of first trenches separated by first column structures in a substrate of semiconductor material;

epitaxially growing an epitaxial layer, wherein epitaxially growing comprises closing top portions of the first trenches; and thermal annealing the epitaxial layer and the first column structures, thereby causing migration of semiconductor material atoms of the first column structures and forming the first buried cavity.

14. The process according to claim 11, wherein forming the second buried cavity comprises forming the second buried cavity within the sensitive region, the second buried cavity delimiting a membrane at a bottom within the sensitive region between the second buried cavity and the first face.

15. The process according to claim 13, wherein forming the second buried cavity comprises:

forming a plurality of second trenches separated by second column structures in the sensitive region;

epitaxially growing an epitaxial layer, wherein epitaxially growing comprises closing top portions of the second trenches; and thermal annealing the epitaxial layer and the second column structures, thereby causing migration of semiconductor material atoms of the second column structures and forming the second buried cavity.

16. The process according to claim 11, wherein forming a second buried cavity comprises:

forming a sacrificial region above the sensitive region;

depositing a structural layer of semiconductor material above the sacrificial region;

forming openings in the structural layer; and removing the sacrificial region through the openings.

17. The process according to claim 16, wherein forming openings comprises defining a suspended structure in the structural layer, the suspended structure being configured to move in response to a force applied thereto.

18. The process according to claim 10, further comprising fixing a cap element to the first face of the monolithic body.

19. An electronic apparatus comprising:

a microprocessor; and a micro-electro-mechanical device, including:

a monolithic body of semiconductor material having a first face and a second face;

a first buried cavity in the monolithic body of semiconductor material;

a sensitive region in the monolithic body facing the first buried cavity;

a second cavity buried in the sensitive region;

a decoupling trench extending from the first face of the monolithic body as far as the first buried cavity and laterally surrounding the second buried cavity, the decoupling trench separating the sensitive region from a peripheral portion of the monolithic body; and a cap coupled to the monolithic body.

20. The electronic device according to claim 19, wherein the electronic apparatus is at least one of a sphygmomanometer, a household apparatus, a mobile phone, a personal digital assistant, a notebook, and a pressure measuring apparatus.

21. The electronic device according to claim 19, wherein the cap is coupled to the first face of the monolithic body and integrates an application-specific integrated circuit.

22. The electronic device according to claim 19, wherein the cap is coupled to the second face of the monolithic body and integrates an application-specific integrated circuit.

23. The electronic device according to claim 22, wherein the monolithic body includes a through hole at the second face that places the first buried cavity in fluid communication with an environment that is external to the micro-electro-mechanical device.

* * * * *